United States Patent [19]
Kinashi et al.

[11] Patent Number: 5,512,607
[45] Date of Patent: Apr. 30, 1996

[54] UNSATURATED EPOXY ESTER WITH QUATERNARY AMMONIUM AND PHOSPHATE GROUPS

[75] Inventors: Keiichi Kinashi; Hiroshi Samukawa; Reiko Chiba, all of Kanagawa, Japan

[73] Assignee: W. R. Grace & Co.-Conn., New York, N.Y.

[21] Appl. No.: 469,308

[22] Filed: Jun. 6, 1995

[51] Int. Cl.$^6$ ................................................ G03F 7/004
[52] U.S. Cl. ...................... 522/100; 522/39; 525/502; 525/531
[58] Field of Search ........................... 525/502, 531, 525/327.3; 522/100, 39

[56] References Cited

U.S. PATENT DOCUMENTS

| | | | |
|---|---|---|---|
| 3,929,743 | 12/1975 | Sramek | 260/80.8 |
| 3,953,309 | 4/1976 | Gilano et al. | 204/159.16 |
| 4,025,692 | 5/1977 | Yamagishi et al. | 525/531 |
| 4,079,028 | 3/1978 | Emmons et al. | 260/29.6 NR |
| 4,100,047 | 7/1978 | McCarty | 204/159.23 |
| 4,115,328 | 9/1978 | Bozzi et al. | 260/24 |
| 4,133,909 | 1/1979 | Spencer | 427/54 |
| 4,151,143 | 4/1979 | Blank et al. | 260/29.6 RW |
| 4,186,069 | 1/1980 | Muzyczko et al. | 430/175 |
| 4,293,476 | 10/1981 | Moore et al. | 260/29.7 W |
| 4,304,703 | 12/1981 | Das | 260/29.6 WB |
| 4,361,640 | 11/1982 | Pine | 430/275 |
| 4,426,485 | 1/1984 | Hoy et al. | 524/591 |
| 4,434,278 | 2/1984 | Skiscim | 525/531 |
| 4,510,230 | 4/1985 | Coveleskie et al. | 430/273 |
| 4,564,580 | 1/1986 | Ichimura et al. | 430/281 |
| 4,713,298 | 12/1987 | Hung et al. | 428/461 |
| 4,743,698 | 5/1988 | Ruffner et al. | 549/478 |
| 4,943,513 | 7/1990 | Lipson et al. | 430/260 |
| 4,950,580 | 8/1990 | Hilger | 430/281 |
| 4,952,481 | 8/1990 | Seio et al. | 430/284 |
| 4,965,294 | 10/1990 | Ohngemach et al. | 522/79 |
| 5,045,435 | 9/1991 | Adams et al. | 430/288 |
| 5,168,087 | 12/1992 | LiBassi et al. | 502/164 |
| 5,178,988 | 1/1993 | Leech et al. | 430/280 |
| 5,232,815 | 8/1993 | Browne et al. | 430/191 |
| 5,320,933 | 6/1994 | Lundy et al. | 430/283 |
| 5,364,736 | 11/1994 | Eramo, Jr. et al. | 430/280 |
| 5,364,737 | 11/1994 | Barr | 430/281 |
| 5,387,494 | 2/1995 | Barr et al. | 430/281 |
| 5,389,495 | 2/1995 | Barr | 430/281 |

FOREIGN PATENT DOCUMENTS

| | | |
|---|---|---|
| 0493317 | 12/1991 | European Pat. Off. . |
| 0518453 | 12/1992 | European Pat. Off. . |
| 56-53155 | 5/1981 | Japan . |
| 2257711 | 1/1993 | United Kingdom . |
| 91/08840 | 6/1991 | WIPO . |
| 92/00552 | 1/1992 | WIPO . |

OTHER PUBLICATIONS

F. W. Billmeyer, Textbook of Polymer Science (2d 1962), pp. 343–347.
F. A. Bovey, Emulsion Polymerization (1955), pp. 271–290.
G. E. Ham. Kinetics and Mechanisms of Polymerization, vol. 2 (1967), pp. 259–290.
Chiou et al., Emulsified Photoresist for Printed Circuit Imaging, MRL Bull. Res. Dev., vol. 2, No. 2 (1988) pp. 13–17.

*Primary Examiner*—Robert E. Sellers
*Attorney, Agent, or Firm*—Valerie E. Looper

[57] ABSTRACT

This invention provides a photosensitive resin composition which can be developed using water and can form a resist layer having superior hardness, adhesion and water resistance.

The photosensitive resin composition of the present invention is characterized by containing an unsaturated epoxyester compound prepared by esterifying some of the epoxy side groups of an unsaturated epoxyester compound, and then reacting the remained epoxy groups of the epoxyester compound with a tertiary amine and acid component, such as phosphoric acid, a monoester of phosphoric acid or a diester of phosphoric acid or combination thereof, to convert the epoxy groups into quaternary ammonium salt groups having phosphate anions.

3 Claims, No Drawings

UNSATURATED EPOXY ESTER WITH QUATERNARY AMMONIUM AND PHOSPHATE GROUPS

FIELD OF THE INVENTION

This invention relates to a photosensitive unsaturated ester compound containing quaternary ammonium salts, and a photosensitive resin composition containing such compound, that may be utilized as an encapsulating material of electronic parts, coating materials such as adhesives, and particularly as the solder resist material for production of printed circuit substrate.

BACKGROUND OF THE INVENTION

Unsaturated epoxy ester resins are used as coatings, because they excel in chemical resistance, water resistance, mechanical property, and bondability. They are widely used as the base resin of liquid photo solder resist materials for the production of printed circuit substrates. Unsaturated epoxy ester resins in which a part of the glycidyl side group has been carboxylated are particularly useful because they are soluble in aqueous alkaline solution, and, therefore, do not require use of organic solvent for development. Furthermore, since mechanical property and bondability may be improved, for example, by combining with epoxy resin, this resin is presently being used for preparing liquid photo solder resists. However, since organic solvent such as aromatic compounds or aliphatic esters are still used to liquefy the resin composition, there are associated health, safety and environmental concerns.

SUMMARY OF THE INVENTION

To solve these problems, various types of resins that use water as the solvent have been studied in recent years as a solder resist. For example, aqueous acrylic resins prepared by neutralizing the carboxyl group with an alkali such as an amine have been proposed, but they have not reached a practical stage. And, although aqueous resins having quaternary ammonium salts prepared by reacting epoxy resin with carboxylic acid and tertiary amine have been reported, they have a poor bondability to the substrate and insufficient water resistance because there is no organic group to bestow bondability.

As a result of an extensive study to develop a new photosensitive resin composition to solve the above problems, the present inventors have discovered that a safe, water-developable, and water-dilutable photosensitive resin composition can be obtained by using as its base a photosensitive unsaturated ester compound obtained by reacting the epoxy residue group of an unsaturated epoxy ester compound with tertiary amine and phosphate compound. Further, it has presently been discovered that a photosensitive resin composition with outstanding bondability, waterproofness and mechanical strength can be obtained with quaternary ammonium salts and phosphate groups incorporated in the resin system.

DETAILED DESCRIPTION

Thus, the present invention is directed to a photosensitive unsaturated epoxy ester compound obtained by reacting the residue of the epoxy side group of the unsaturated epoxy ester compound by esterifying a part of the epoxy side group of the epoxy compound having two or more epoxy side groups with a tertiary amine and a phosphoric acid, phosphoric acid monoester or diester to create a photosensitive unsaturated epoxy ester compound that has phosphate anion and quaternary ammonium salts, and a photosensitive resin composition comprising such compound.

The photosensitive unsaturated epoxy ester compound of this invention may be prepared by reacting an epoxy compound having at least two epoxy side groups in the molecule with a polymerizable monocarboxylic acid having one carboxyl group and one ethylenically unsaturated bond in the molecule to partially esterify the epoxy side group and to form an unsaturated epoxy ester compound that has unsaturated ester groups and unreacted epoxy side groups, and subsequently reacting the unreacted epoxy side groups of the epoxy ester compound with tertiary amine and phosphoric acid, phosphoric acid monoester or phosphoric acid diester or their mixture.

In a preferred embodiment, the photosensitive unsaturated epoxy ester compound of this invention can be obtained by reacting an epoxy compound represented by the formula (I) that has at least two or more units of glycidyl ether side groups

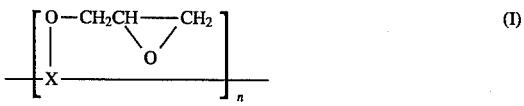

where, X is a repeating unit of glycidyl ether type epoxy resin excepting the glycidyl ether side group;

n is 2–15, and preferably 2–10, with a polymerizable monocarboxylic acid represented by the formula (II)

$$CHR^1=CR^2COOH \quad (II)$$

where, $R^1$ is a hydrogen, a methyl group or phenyl group; and $R^2$ is a hydrogen or a methyl group to convert a part of the unit represented by the above formula (I) into the unit represented by formula (III),

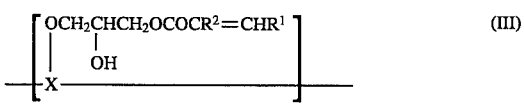

where, X, $R^1$ and $R^2$ are the same as previously defined, and to prepare an unsaturated epoxy ester compound comprising the unit represented by the formula (I) and the unit represented by the formula (III), and subsequently reacting the remainder of the unit in the compound represented by the formula (I) with a tertiary amine represented by the formula (IV)

$$NR^3R^4R^5 \quad (IV)$$

where, $R^3$ and $R^4$ are independent $C_1$–$C_6$, and preferably $C_1$ alkyl group, $R^5$ is a $C_1$–$C_6$, preferably $C_1$–$C_4$ alkyl group, $C_1$–$C_6$, preferably $C_1$–$C_4$ hydroxyalkyl group, $C_1$–$C_6$, preferably $C_1$–$C_4$ alkylarylamido group or benzyl group, and a phosphoric acid, phosphoric acid monoester or phosphoric acid diester represented by the formula (V)

where, $R^6$ is $C_1$–$C_8$, preferably $C_1$–$C_4$ alkyl group; and q is 1, 2, or 3.

This compound has an unit represented by the formula (III) and the unit represented by the formula (VI),

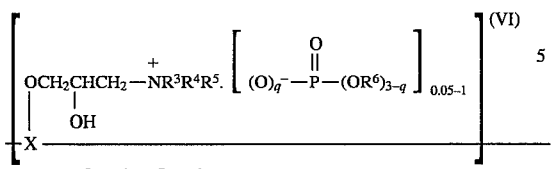

where, X, $R^3$, $R^4$, $R^5$, $R^6$, and q are the same as previously defined, where the unit represented by the formula (III) and the unit represented by the formula (VI) are combined as a block or randomly, the number of units represented by the formula (III) in a molecule is 1–14, and preferably 1–9, and the number of units represented by the formula (VI) is 1–14, and preferably 1–9, and the total number of these groups combined is n.

To synthesize the photosensitive unsaturated epoxy ester compound of this invention, first the epoxy compound having at least two epoxy side groups in the molecule is reacted with a polymerizable monocarboxylic acid that has one carboxyl group and one ethylenically unsaturated bond in the molecule, to partially esterify the said epoxy side group, and to prepare an unsaturated epoxy ester compound having unsaturated ester group and unreacted epoxy side group.

In a preferred embodiment, the epoxy compound that has at least two epoxy side groups in the molecule and can be used in the above-said reaction can be expressed by the formula (I)

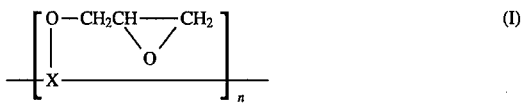

where, X is the same as previously defined, and n=2–15, preferably 2–10.

Examples of such epoxy compound are the epoxy resins represented by the formula (VII).

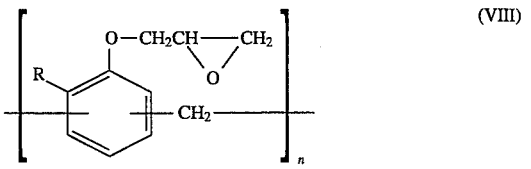

where, R is a hydrogen or a methyl group; and n is 2–15, and preferably 2–10.

In other words, it is a compound where the group X in the formula (I) is a compound represented by the formula (VIII),

such as phenol Novolak type epoxy resin (R=H) or ortho-cresol Novolak type epoxy resin (R=CH₃). Specific examples are the cresol Novolak type epoxy resin YDCN-704 (R=CH₃, epoxy equivalent=200, average molecular weight=1800) and YDCN-702 (R=CH₃, epoxy equivalent=200, average molecular weight=1400) from Toro Kasei K.K., and phenol Novolak type epoxy resin EPPN-201 (R=H, epoxy equivalent=180, average molecular weight=1300) from Nippon Kayaku K. K. and so on. If necessary, these epoxy compounds may be used in combination.

Compounds having ethylenically unsaturated bonds and carboxyl groups in the molecule, represented by the formula (II), $$CHR^1=CR^2COOH \quad (II)$$

where, $R^1$ and $R^2$ are the same as defined before, can be used as the polymerizable monocarboxylic acid which is reacted with a part of the glycidyl ether side group of the epoxy compound. Examples are acrylic acid, methacrylic acid, crotonic acid, and cinnamic acid and so on. And, if necessary, the above-said polymerizable monocarboxylic acid may be used together with other carboxylic acids.

As to the reaction ratio of the epoxy compound and polymerizable monocarboxylic acid in this invention, it is desirable to set the ratio of carboxyl group to the epoxy group at 0.1–0.95, preferably 0.3–0.9. If the carboxyl/epoxy ratio is less than 0.1, light-curability will be poor. On the other hand, although light-curability may improve when the ratio exceeds 0.95, it tends to lower the water developability of the photosensitive unsaturated ester resin which is synthesized by reacting with these components and it will be difficult or impossible to use water to dilute the resin and a composition containing such resin.

Examples of the catalyst that can be used in the reaction of epoxy compound and polymerizable monocarboxylic acid in this invention are tetraethylammonium bromide; amines such as benzylamine, tributylamine and imidazole and the like; and organic phosphorus compounds such as triethyl phosphine, tributyl phosphine, and triphenyl phosphine and the like. Although no solvent is needed for such reaction, it is possible to use a solvent to run the reaction easier. In such case, it is desirable to use alcohol solvents, such as diethyleneglycol monoethyl ether, diethyleneglycol monomethyl ether, ethyleneglycol monoethyl ether, ethyleneglycol monomethyl ether, or ethyleneglycol monobutyl ether and the like, that do not suffer safety problems. Normally, the reaction is carried out by heating at about 50°–150° C., and preferably at about 70°–120° C., until the reaction of carboxyl group and epoxy group has been completed and all polymerizable monocarboxylic acid has been consumed. In this case, a polymerization inhibitor such as quinones, phenol, polyvalent phenols or nitro compound may be used to prevent polymerization of the acryl group during the reaction.

A part of the unit of the epoxy compound represented by the formula (I) will be esterified when the epoxy compound and the polymerizable monocarboxylic acid are reacted. In a preferred embodiment, such esterified unit can be expressed by the formula (III).

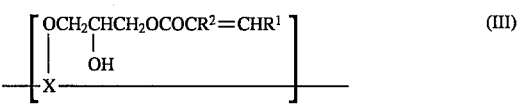

where, X, $R^1$ and $R^2$ are the same as defined before.

Subsequently, the unsaturated epoxy ester compound obtained by the above-described reaction is reacted with a tertiary amine and an acid component such as phosphoric acid, phosphoric acid monoester or phosphoric acid diester, to convert the remaining epoxy group in the unsaturated epoxy ester compound into a quaternary ammonium salt that contains phosphate anion.

The tertiary amines which are used for this reaction can be expressed, preferably, by the formula (VI).

$$NR^3R^4R^5 \quad (IV)$$

where, $R^3$, $R^4$, and $R^5$ are the same as previously defined. Although there is no particular restriction about the type of tertiary amines that can be used in such reaction, dimethylaminoalkyls such as dimethylaminoethanol, dimethylbutylamine, dimethylbenzylamine, dimethylaminopropylacrylamide are preferred from the viewpoint of reactivity.

Phosphoric acid, phosphoric acid monoesters or phosphoric acid diesters that can be used as the acid component can be expressed, preferably, by the formula (V).

where, $R^6$ and q are the same as previously defined.

Examples of phosphate compounds that can be used are phosphoric acid; monoalkyl phosphates such as monobutyl phosphate, monooctyl phosphate and so on; dialkyl phosphates such as diethyl phosphate, dibutyl phosphate, dioctyl phosphate and so on; or their mixture, such as a mixture of monoethyl phosphate and diethyl phosphate (for example, JP-502, from Johoku Kagaku K.K.), and a mixture of monobutyl phosphate and dibutyl phosphate (for example, JP-504, from Johoku Kagaku K.K.), used alone or as a mixture.

As to the ratio of the reactants, i.e. unsaturated epoxy ester compound, tertiary amine, and phosphoric acid compound to be used in this reaction, it is desirable to set the ratio of the remaining epoxy group in the unsaturated epoxy ester compound, amine group in the tertiary amine and phosphate group in the phosphoric acid compound at 1:1:0.5–1. Weight ratio of lower than 0.5 for the phosphate group is not desirable because it slows down the reaction velocity, and weight ratio of higher than 1 is not desirable because it tends to cause side reactions. Preferred reaction temperature is from room temperature to 70° C. If the temperature is lower than room temperature, reaction will take a longer time. On the other hand, if the temperature exceeds 70° C., the resin tends to gel during the reaction. End point of the reaction can be confirmed by disappearance of epoxy peak using IR analysis.

With this reaction, the remaining epoxy group in the unsaturated epoxy ester compound is converted into a quaternary ammonium salt that has phosphate anion. This quaternary ammonium salt that has phosphate anion can be expressed, preferably, by the formula (VI).

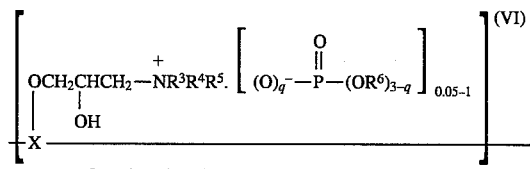

where, $X$, $R^3$, $R^4$, $R^5$, $R^6$, and q are the same as previously defined.

The photosensitive unsaturated ester compound of this invention obtained by the above-said reaction has the unit represented, preferably, by the formula (III) that has unsaturated esterified epoxy side group and the unit represented, preferably, by the formula (VI) that has quaternary ammonium salt having phosphate anion, combined in random or graft fashion, and comprises 1–14, preferably 1–9, of the unit having unsaturated esterified epoxy side groups, and comprises 1–14, preferably 1–9, of the quaternary ammonium salts having phosphate anions in the molecule.

Because the photosensitive unsaturated ester compound obtained by the above reaction has unsaturated ester side group, it shows an outstanding photopolymerizability. And, because it contains quaternary ammonium salt having phosphate anion, it shows excellent water solubility.

The photosensitive resin composition of this invention can be prepared by mixing a photopolymerization initiator with the photosensitive unsaturated ester compound of this invention. Examples of the photopolymerization initiator that can be used in the photosensitive resin composition of this invention include quinones such as 2-ethylanthraquinone, 2-butylanthraquinone, acetamethylanthraquinone, and the like; α-ketaldonyl alcohols or ethers such as benzoin ether, pivaloin ether, acyloin ether and the like; and ketones such as α-phenyl benzoin, α-α'-diethoxy acetophenone, benzophenone, α,α'-dimethoxy-α-morpholinomethyl thiophenyl acetophenone, diethyl thioxantone and the like. These compounds can be used alone or as a mixture of two or more. The amount of such photopolymerization initiator to be used is 1–50 weight parts, and preferably 2–20 weight parts, based on the amount of the photosensitive unsaturated ester compound.

Amine resin or blocked isocyanate can be included as a thermal curant (hardener) in the photosensitive resin composition of this invention to improve the bondability, waterproofness, and mechanical property of the composition. Here, amine resin is the initial condensation product obtained by reacting an aldehyde with the amine group-containing compound such as melamine, urea and benzoguanamine and so on. Examples include trimethylol melamine, tetramethylol melamine, hexamethylol melamine, hexamethoxy methylol melamine, melamine resins from Sanwa Chemicals K.K., such as MW-30, MW-30M, MW-22, MX-025, MX-031, and MX-041. When these amine resins are used, it is desirable to add an acid to enhance the reaction of the amine resin and the photosensitive unsaturated ester compound. Inorganic acids such as phosphoric acid, hydrochloric acid, or sulfuric acid may be used as the acid for this purpose. However, organic acids such as p-toluene sulfonic acid, and the like are preferred because they are not corrosive to the metal. Examples of the blocked isocyanate which can be used as the thermal curant (hardener) in the composition of this invention include blocked tolylene diisocyanate, blocked methylene diisocyanate, and blocked hexamethylene diisocyanate and the like. Preferred ratio of the photosensitive unsaturated ester compound and the amino resin or blocked isocyanate is 95:5–50:50.

Beside water, an alcohol compound which is relatively safe can be used as a diluent to adjust the viscosity of the photosensitive composition of this invention. Examples of the alcohol diluent that can be used for such purpose include diethyleneglycol monoethyl ether, diethyleneglycol monomethyl ether, ethyleneglycol monoethyl ether, ethyleneglycol monomethyl ether, and ethyleneglycol monobutyl ether and the like, which is the solvent being used in the synthesis of unsaturated epoxy ester compound.

Also, a photopolymerizable monomer may be added in the composition to improve photocurability of the composition. Preferred amounts of photopolymerizable monomer to be added for such purpose are no more than about 50 weight %, based on the amount of the photosensitive unsaturated ester compound. Examples of the photopolymerizable monomer that can be used for such purpose include 2-hydroxyethyl acrylate, 2-hydroxypropyl acrylate, N-vinyl pyrrolidone, acryloyl morpholine, methoxytetraethyleneglycol acrylate, methoxypolyethyleneglycol acrylate, polyethyleneglycol diacrylate, N,n-dimethyl acrylamide, N-methylol acrylamide, N,N-dimethylaminopropyl acrylamide, N,N-dimethylaminoethyl acrylate, melamine acrylate, diethyleneglycol diacrylate, triethyleneglycol diacrylate, propyleneglycol diacryalte, dipropyleneglycol diacrylate, tripropyleneglycol diacrylate, polypropyleneglycol diacrylate, phenoxyethyl acrylate, tetrahydrofurfuryl acrylate, cycolhexyl acrylate, trimethylolpropane triacrylate, glycerindiglycidyl ether diacrylate, pentaerythritol triacrylate, pentaerythritol tetracylrate, pentaerythritol pentacrylate, pentaerythritol hexacryalte, dipentaerythritol pentacrylate, dipentaerythritol hexacrylate, and methacylates that corresponds to the above-said acrylate. These compounds may be used alone or in mixtures thereof.

Furthermore, any known additives that would be apparent to those skilled in the art may also be used, including fillers such like barium sulfate, silica, talc, clay, alumina, aluminum hydroxide and the like; coloring agent such as phthalocyanine green, titanium oxide, carbon black and the like; leveling agent such as silicone oil and the like; bonding promoter, UV absorber, as well as other additives known in the art.

The photosensitive resin composition of this invention prepared in the afore-said manner may be developed with water and using an aqueous solvent as a diluent because it contains quaternary ammonium salt having phosphate anion. Therefore, it can solve the problems of the conventional solder mask, such as obnoxious odor, air pollution, and harmful effect to humans. In addition, it can yield a coating that excels in bondability to substrate, waterproofness and mechanical strength.

Preferred embodiments of this invention are explained further by the following Examples of Synthesis, Comparative Examples, and Examples, however, it will be appreciated that they are not intended to limit the scope of this invention.

SYNTHESIS OF UNSATURATED EPOXY ESTER COMPOUNDS EXAMPLE OF SYNTHESIS 1

Cresol Novolak type epoxy resin YDCN-702 (a product of Toto Kasei K.K., epoxy equivalent=200, average molecular weight=1400) 200 g was dissolved in diethyleneglycol monoethyl ether 150 g. After adding hydroquinone 0.05 g as the polymerization inhibitor, acrylic acid 61.2 g (0.85 mol) and tetraethylammonium bromide 3.5 g were added. While air was blown into the system, acylation was carried out at 90° C. End point of the reaction was determined by titration of the reaction mixture with alcoholic potassium hydroxide solution using Phenolphthalein as the indicator. When the acid value reached 0, it was regarded as the end point of the reaction. A faintly brown liquid product 414.7 g (yield=100%) was thus obtained. Result of IR analysis showed a peak attributable to the C=O absorption of the ester group near 1730 cm$^{-1}$. Concentration of the residual epoxy group in the product, determined by the method specified in JIS 7236-1986, was 0.15 mol.

EXAMPLE OF SYNTHESIS 2

Cresol Novolak type epoxy resin YDCN-704 (a product of Toto Kasei K.K., epoxy equivalent=200, average molecule weight=1800) 200 g was dissolved in diethyleneglycol monoethyl ether 150 g. After adding hydroquinone 0.05 g as the polymerization inhibitor, acrylic acid 57.6 g (0.8 mol) and tetraethylammonium bromide 3.5 g were added. While air was blown into the reaction system, acylation was carried out at 90° C. End point of the reaction was the time when the acid value reached 0, by titrating with alcoholic potassium hydroxide solution using Phenolphthalein as the indicator. A faintly brown liquid product 411.1 g (yield=100%) was thus obtained. Result of IR analysis showed a peak attributable to the C=O absorption of the ester group near 1730 cm$^{-1}$. Concentration of the residual epoxy group in the product was determined by the procedure of the Example of Synthesis 1, as 0.20 mol.

EXAMPLE OF SYNTHESIS 3

Phenol Novolak type epoxy resin EPPN-201 (a product of Nippon Kayaku K.K., epoxy equivalent=180, average molecular weight=1300) 180 g was dissolved in diethyleneglycol monoethyl ether 100 g. After adding hydroquinone 0.05 g as the polymerization inhibitor, acrylic acid 57.6 g (0.8 mol) and tetraethylammonium bromide 2.8 g were added, and while blowing in the air, acylation was carried out at 90° C. End point of the reaction was the time when the acid value reached 0, by titrating with alcoholic potassium hydroxide solution using Phenolphthalein as the indicator. Faintly brown liquid product 340.9 g was obtained as the product (yield=100%). Result of IR analysis showed a peak attributable to the C=O group of the ester group near 1730 cm$^{-1}$. Concentration of the residual epoxy group in the product, determined by the procedure described under Example of Synthesis 1, was 0.20 mol.

EXAMPLE OF SYNTHESIS 4

Cresol Novolak type epoxy resin YCDN-702 (a product of Toto Kasei K.K., epoxy equivalent=200, average molecular weight=1400) 200 g was dissolved in diethyleneglycol monoethyl ether 150 g. After adding hydroquinone 0.05 g as the polymerization inhibitor, acrylic acid 70.56 g (0.98 mol) and tetraethylammonium bromide 3.5 g were added, and while blowing in the air, acylation was carried out at 90° C. End point of the reaction was the time when the acid value reached 0, by titrating with alcoholic potassium hydroxide solution using Phenolphthalein as the indicator. Faintly brown liquid product 424.1 g was obtained (yield=100%). Result of IR analysis showed a peak attributable to the C=O absorption of the ester group near 1730$^{-1}$. Concentration of the residual epoxy group in the product was determined in the same manner as the Example of Synthesis 1, and it was 0.02 mol.

EXAMPLE OF SYNTHESIS 5

Dimethylaminoethanol 13.35 g and phosphoric acid 4.95 g were added to 414.75 g of the unsaturated epoxy ester compound obtained in the Example of Synthesis 1. They were reacted at 50° C. for 24 hours, to convert the residual epoxy group of the epoxy ester compound. Thus, 433.0 g of the unsaturated epoxy ester compound of this invention containing quaternary ammonium salt having the epoxy ester side group and phosphate anion were obtained as a faintly brown-colored liquid product (yield=100%). When the product was analyzed by IR analysis, the absorption peak near 910 cm$^{-1}$ which was attributable to the epoxy group could not be found. This formed compound is called "Compound 1". This compound could be diluted with water.

Unsaturated epoxy ester compounds obtained in Examples of Synthesis 1–4 were reacted with various types of amines and phosphate compound in a manner illustrated in Table 1, to convert the residual epoxy group of the unsaturated epoxy ester compounds, and thus Compounds 2–7 were obtained.

EXAMPLE 1

IRGACURE 907 (α-α'-dimethoxy-α-morpholinomethyl thiophenyl acetophenone, a product of Ciba-Geigy Co.) 23 g and DETX (diethyl thioxantone, a product of Nippon Kayku K.K.) 2.3 g as the photopolymerization initiator, amino resin (MW-30, a derivative of the condensation product of melamine and formaldehyde, a product of Sanwa Chemical K.K.) 24 g as the curant, p-toluene sulfonic acid 2 g as the curing catalyst, trimethyllpropane triacrylate (M-309, a product of Toa Gosei K.K.) 24 g, and silicone oil (TSA-750S, a product of Toshiba Silicone K.K.0 5 g as the antifoam, were added to 428.1 g of the Compound 1, to prepare the photosensitive resin composition of this invention.

EXAMPLES 2–5 AND COMPARATIVE EXAMPLES 1 AND 2

Various components illustrated in Table 2 were used to prepare various photosensitive resin compositions of this invention by the procedure described earlier, and their properties were evaluated. Each of the thus-prepared photosensitive resin compositions was coated on a printed circuit substrate to a thickness of 20–30 μm by using a screen printer, and then dried at 80° C. for 20 minutes, to form a resist layer. It was exposed to UV light through a negative film placed over the resist layer (exposure condition: 500 mj/cm$^2$), and then the unexposed area was developed by spraying with tap water by applying a pressure of 2 kg/cm$^2$. Then, the formed image was thermally cured at 150° C. for 30 minutes. Pencil harness of the thus-obtained image was determined by scratching the surface of the resist film with a Mitsubishi UNIPENCILs having different hardness, and then the damage caused to the surface of the film was examined. For bondability, the film was cross-cut in a checkerboard fashion, and then an ordinary cellophane tape was pasted on the surface and then pulled. The number of small squares which was not peeled off from the surface (total number of small checkerboard squares was 100) was counted. To test the water resistance (boiling test), sample was kept in boiling water at 100° C. for 1 hour, and then the external appearance (swelling, bulge, whiteness, etc.) of the resist film was visually examined.

Compared to the resin compositions obtained in Comparative Examples 1 and 2, the resin compositions obtained in Example 1–5 showed excellent water developability, and they formed resist film with excellent water resistance, bondability and hardness.

TABLE 1

Synthesis of unsaturated epoxy ester compound containing quaternary ammonium base having phosphate anion

| | Compound 1 | Compound 2 | Compound 3 | Compound 4 | Compound 5 | Compound 6 | Compound 7 |
|---|---|---|---|---|---|---|---|
| Unsaturated epoxy ester (g) | | | | | | | |
| Example of Synthesis 1 | 414.75 | 414.75 | | | | | 414.74 |
| Example of Synthesis 2 | | | 411.15 | 411.15 | | | |
| Example of Synthesis 3 | | | | | 340.45 | | |
| Example of Synthesis 4 | | | | | | 424.11 | |
| Amines (g) | | | | | | | |
| Amine 1 | 13.35 | 13.35 | 17.8 | | 17.8 | 1.78 | 13.35 |
| Amine 2 | | | | 28.4 | | | |
| Phosphate compound (g) | | | | | | | |
| Phosphoric acid 1 | 4.95 | | | | | | |
| Phosphate 2 | | 15.15 | | 20.2 | 20.2 | 2.02 | |
| Phosphate 3 | | | 10.0 | | | | |
| Acetic acid (g) | | | | | | | 9.01 |
| Reaction condition | | | at 50° C. for 24 hours | | | | |

Notes
Amine 1 = Dimethylaminoethanol
Amine 2 = Dimethylaminopopyl acrylamide
Phosphoric acid 1 = Phosphoric acid
Phosphate 2 = A mixture of monoethyl phosphate and diethyl phosphate (JP-502, acid value = 553 KOH mg/g, a product of Johoku Kagaku K.K.)
Phosphate 3 = Monoethyl phosphate

TABLE 2

Protocol of photosensitive resin composition and properties

| | Examples | | | | | Comparative Examples | |
|---|---|---|---|---|---|---|---|
| | 1 | 2 | 3 | 4 | 5 | 1 | 2 |
| | | | | | Compound No. | | |
| | 1 | 2 | 3 | 4 | 5 | 6 | 7 |
| Unsaturated epoxy ester (g) | 428.1 | 433.05 | 443.25 | 449.15 | 459.71 | 427.91 | 437.1 |
| Photopolymerization initiator | | | | | | | |
| IRGACURE 907 | 23 | 23 | 23 | 23 | 23 | 23 | 23 |
| DETX | 2.3 | 2.3 | 2.3 | 2.3 | 2.3 | 2.3 | 2.3 |
| Antifoam (g), TSA-7505 | 5 | 5 | 5 | 5 | 5 | 5 | 5 |
| Amine resin (g), | | | | | | | |

TABLE 2-continued

Protocol of photosensitive resin composition and properties

|  | Examples | | | | | Comparative Examples | |
|---|---|---|---|---|---|---|---|
|  | 1 | 2 | 3 | 4 | 5 | 1 | 2 |
|  | Compound No. | | | | | | |
|  | 1 | 2 | 3 | 4 | 5 | 6 | 7 |
| MW-30 | 24 | 24 |  | 0 | 0 | 24 | 24 |
| MW-22 |  |  | 24 |  |  |  |  |
| Blocked isocyanate (g) | 0 | 0 | 0 | 30 | 0 | 0 | 0 |
| Curing catalyst (g) PTS | 2 | 2 | 2 | 0 | 0 | 2 | 2 |
| M-309 (g) | 24 | 0 | 24 | 24 | 24 | 24 | 24 |
| Developability with water (30 seconds) | Good | Good | Good | Good | Good | Poor | Good |
| Dilutability with water | Good | Good | Good | Good | Good | Poor | Good |
| Pencil hardness | 4H | 4H | 4H | 4H | 4H | 4H | 4H |
| Bondability (Cross-cut/100) | 100 | 100 | 100 | 100 | 100 | 100 | 50 |
| Boiling test (100° C/1 hour) | Good | Good | Good | Good | Good | Good | Poor (bulged) |

IRGACURE 907: α,α-Dimethoxy-a-morpholinomethyl thiophenyl acetophenone (product of Ciba-Geigy Co.)
DETX: Diethylthioxanthone (product of Nippon Kayaku K.K.)
TSA-750S: Silicone oil (product of Toshiba Silicone K.K.)
MW-30: Derivative of the condensation product of melamine and formaldehyde (product of Sanwa Chemicals K.K.)
MW-22: Derivative of the condensation product of melamine and formaldehyde (product of Sanwa Chemicals K.K.)
Blocked isocyanate: CORONATE AP Staple (tolylene diisocyanate type, a product of Nippon Polyurethane Kogyo K.K.)
PIS: p-Toluenesulfonic acid
M-309: Trimethylolpropane triacrylate (product of Toa Gosei K.K.)

We claim:

1. A photosensitive resin composition which comprises a photosensitive unsaturated ester compound containing unsaturated ester groups and quaternary ammonium salt groups having phosphate anions, and a photopolymerization initiator, the photosensitive unsaturated ester compound being prepared by reacting an epoxy compound having at least two epoxy side groups in its molecule with a polymerizable monocarboxylic acid having one carboxyl group and one ethylenically unsaturated bond in its molecule, thereby esterifying some of the epoxy side groups to prepare an unsaturated epoxyester compound having unsaturated ester groups and unreacted epoxy side groups, and then reacting the unreacted epoxy groups of the epoxyester compound with a tertiary amine as well as phosphoric acid, a monoester of phosphoric acid or a diester of phosphoric acid or a combination thereof.

2. A photosensitive unsaturated ester compound comprising the unit represented by formula (III),

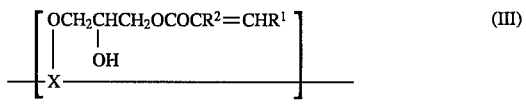

where X is a repeating unit of glycidyl ester type epoxy resin except the glycidyl ether side group; $R^1$ is a hydrogen, methyl group or phenyl group; and $R^2$ is hydrogen or methyl group, and the unit represented by the formula (VI),

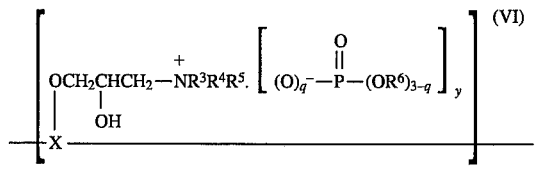

where, X is a repeating unit of glycidyl ether type epoxy resin except the glycidyl ether side group; $R^3$ and $R^4$ are independent $C_1$–$C_6$ alkyl groups, respectively; $R^5$ is a group selected from, $C_1$–$C_6$ alkyl group, $C_1$–$C_6$ hydroxylakyl group, $C_1$–$C_6$ alkylacrylamide group or benzyl group; $R^6$ is a $C_1$–$C_6$ alkyl group; q is 1, 2, or 3; and y is 0.05 to 1, wherein the unit represented by the formula (III) and the unit represented by the formula (VI) are combined as a block or randomly, and the number of the units represented by the formula (III) in the molecule is 1–14 and number of the units represented by the formula (VI) in the molecule is 1–14, and the total number of these units combined is n, where n is 2–15.

3. A photosensitive resin composition comprising a photosensitive unsaturated ester compound of claim 2 and a photopolymerization initiator.

* * * * *